United States Patent [19]
Tung

[11] Patent Number: 6,063,671
[45] Date of Patent: May 16, 2000

[54] METHOD OF FORMING A HIGH-VOLTAGE DEVICE

[75] Inventor: Ming-Tsung Tung, Hsinchu Hsien, Taiwan

[73] Assignee: United Microelectronics Corp., Hsinchu, Taiwan

[21] Appl. No.: 09/204,137

[22] Filed: Dec. 2, 1998

[51] Int. Cl.[7] .............................................. H10L 21/8234
[52] U.S. Cl. ........................... 438/275; 438/286; 257/296
[58] Field of Search ................................... 438/197, 275, 438/286; 257/296

*Primary Examiner*—George Fourson
*Assistant Examiner*—Long Pham

[57] ABSTRACT

A method of forming a high-voltage device is provided. A substrate with a first electrical type is provided. A first doped region with a second electrical type is formed in a portion of the substrate. A first field oxide layer and a second field oxide layer are formed on the first doped region and on the substrate near the first doped region. A second doped region with the second electrical type is formed in the substrate between the first field oxide layer and the second field oxide layer. Doping concentration of the second doped region is higher than of the first doped region. A third doped region with the first electrical type is formed in the substrate near the second field oxide layer. Doping concentration of the third doped region and doping concentration of the first doped region are the same. A source region is formed within the top portion of the first doped region near the first field oxide layer. A drain region is formed within the top portion of the third doped region near the second field oxide layer. A fourth doped region is formed within the top portion of the third doped region near the source region. Doping concentration of the fourth doped region is higher than of the third doped region. The second field oxide layer is removed. A gate oxide layer is formed at the position of the second field oxide layer. Openings are formed to expose a part of the source/drain region and a part of the fourth doped region. Conductor fills the openings to form a gate electrode, a source electrode and a drain electrode.

12 Claims, 3 Drawing Sheets

METHOD OF FORMING A HIGH-VOLTAGE DEVICE

BACKGROUND OF THE INVENTION

1. Field of the Invention

The invention relates in general to the fabricating method of semiconductor integrated circuits (ICs), and more particularly to a method of forming a high-voltage device.

2. Description of the Related Art

A high-voltage device is one of the most important devices utilized in highly integrated circuits. In an integrated circuit, high voltage devices such as electrically programmable read-only memories (EPROM) or flash memories are often included. While programming a flash memory, the source is typically grounded or zero biased, whereas a voltage of about 12V is applied to the gate and a voltage of about 7V is applied to the drain. Under this condition, a hot electron injection is very likely to occur in the channel region between the drain and the source. The mechanism of the hot electron injection is the Fowler-Nordheim (F-N) tunneling effect. For a reading operation, a voltage of about 5V is applied to the gate, whereas the voltage applied to the drain is required to be higher than that to the source. Furthermore, while erasing, the drain is in a floating status, whereas the gate is grounded and a voltage of about 12V is applied to the source. In general, operating a device under high voltage can increase the speed of a read or a write operation. Thus, a high-voltage device, which can be operated under high voltage, are required in integrated circuit.

Due to the increasing number of semiconductor devices incorporated in integrated circuits, the size of transistors needs to be decreased. Accordingly, as the channel length of the transistor is decreased, the operating speed is increased. However, there is an increased likelihood of a problem, referred to as a "short channel effect", caused by the reduced channel length. If the voltage level is fixed, according to the equation of electrical field=electrical voltage/channel length, then, as the channel length is shortened, the strength of the electrical field is increased. Thus, as the strength of the electrical field increases, energy of electrons increases and electrical breakdown is likely to occur.

In a conventional high-voltage device, occurrence of potential crowding on the edge of the drain region decreases breakdown voltage. In order to increase the breakdown voltage and make the device operable under high voltage, the doping concentration of the drift region must be decreased. Unfortunately, as the doping concentration of the drift region decreases, the current driving performance decreases.

In the conventional high-voltage device, the formation of an isolation layer is used for the purpose of increasing the channel length. In addition, a lightly doped ion implantation is performed on the junction between a depletion region and a source/drain region in order to decrease the hot electron effect. In this way, the breakdown voltage of the source/drain region increases. The high-voltage device is able to work normally under a high electrical voltage.

FIG. 1 is a schematic, cross-sectional view showing a portion of a conventional high-voltage device.

In FIG. 1, a field oxide layer 102 is formed in the P-type silicon substrate 100. A gate oxide layer 104 is formed on the substrate 100 and beside the field oxide layer 102.

The field oxide layer 102 is used to increase the channel length between an $N^+$-type source region 106 and an $N^+$-type drain region 108. An $N^+$-type lightly doped region 110 is under the $N^+$-type drain region 108 and under the field oxide layer 102. A $P^-$-type lightly doped region 112 is under the source region 106. A portion of a gate 114 is on the gate oxide layer 104 and the other portion of the gate 114 is on the field oxide layer 102. The $N^-$-type lightly doped regions 110 and the $P^-$-type lightly doped region 112 are used as drift regions for carriers while the device is operated. As a junction depth of the $N^-$-type lightly doped regions 110 and the $P^-$-type lightly doped region 112 increases, the effective channel length decreases. There is also a P-N junction (not shown) formed between the $N^-$-type lightly doped region 110 and the P-type substrate 100. The P-N junction region are called depletion region. The electrical distribution lines, which are nearby the channel, of the $N^+$-type lightly doped drain region 108 have higher curvature while the device is operated under high voltage. The breakdown voltage thus is decreased. Consequently, the device cannot work normally under high voltage.

SUMMARY OF THE INVENTION

It is therefore an object of the invention to provide a method of forming a high-voltage device to control a channel length between the source/drain region to prevent short channel effect.

It is another object of the invention to provide a method of forming a high-voltage device that decreases the curvature of the electrical distribution lines, which are nearby the channel, of the drain region while the device is operated under high voltage.

The invention achieves the above-identified objects by providing a method of forming a high-voltage device. A substrate with a first electrical type is provided. A first doped region with a second electrical type is formed in a portion of the substrate. A first field oxide layer and a second field oxide layer are formed on the first doped region and on the substrate near the first doped region. A second doped region with the second electrical type is formed in the substrate between the first field oxide layer and the second field oxide layer. Doping concentration of the second doped region is higher than of the first doped region. A third doped region with the first electrical type is formed in the substrate near the second field oxide layer. Doping concentration of the third doped region and a doping concentration of the first doped region are the same. A source region is formed within the top portion of the first doped region near the first field oxide layer. A drain region is formed within the top portion of the third doped region near the second field oxide layer. A fourth doped region is formed within the top portion of the third doped region near the source region. Doping concentration of the fourth doped region is higher than that of the third doped region. The second field oxide layer is removed. A gate oxide layer is formed at the position of the second field oxide layer. Openings are formed to expose a part of the source/drain region and a part of the fourth doped region. Conductor fills the openings to form a gate electrode, a source electrode and a drain electrode.

According to the invention, the first electrical type is P-type and the second electrical type is N-type or the first electrical type is N-type and the second electrical type is P-type. The doping concentrations of the first doped region and of the third doped region are lower than that of other doped regions so that hot electron effect is decreased to increase breakdown voltage of the high-voltage device. The second doped region is used to prevent a decrease in the current driving performance while decreasing the doping concentration of a drift region.

The invention provides a drift region structure to increase the breakdown voltage and to preserve the current driving performance. The dishing gate electrode decreases the curvature of the electrical distribution lines, which are nearby the channel, of the drain region while the device is operated under high voltage. Furthermore, the second doped region with the high doping concentration is formed using a self-aligned process so that the channel length between the source region and the drain region is easily controlled.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
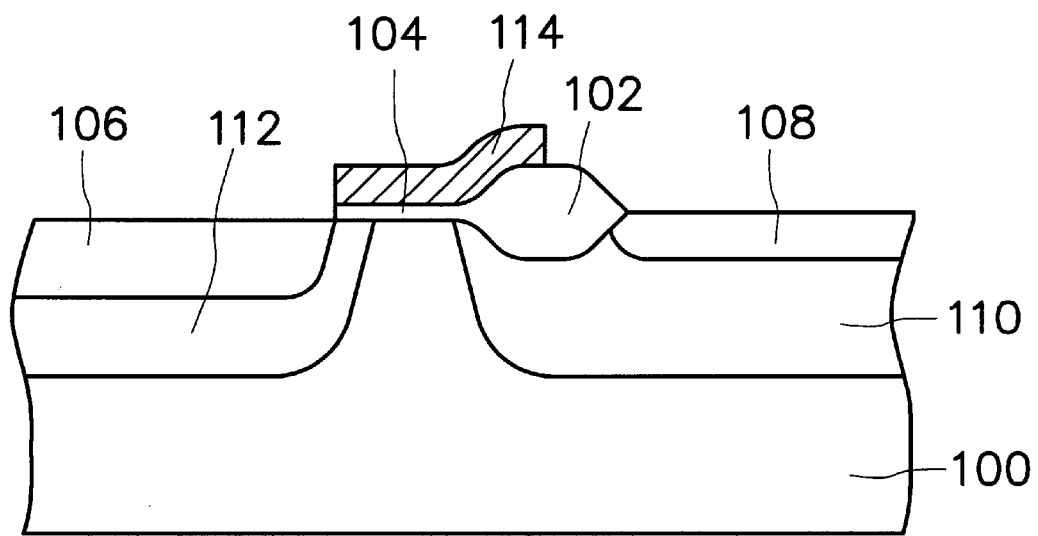
FIG. 1 is a schematic, cross-sectional view showing a portion of a conventional high-voltage device.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views showing a portion of a high-voltage device according to one preferred embodiment of the invention.

As seen in the following description according to one preferred embodiment of the invention, a P-type silicon substrate 200 is provided to form a high-voltage device. For example, an NMOS device is formed on a P-type silicon substrate 200 or a PMOS can also be formed on an N-well in the P-type silicon substrate 200. The present invention can also be applied to a high-voltage device formed on an N-type silicon substrate. Those skilled in the art will be able to see that the high-voltage device can be completed by the N-type silicon substrate according to the method of the invention.

Figure 2A:
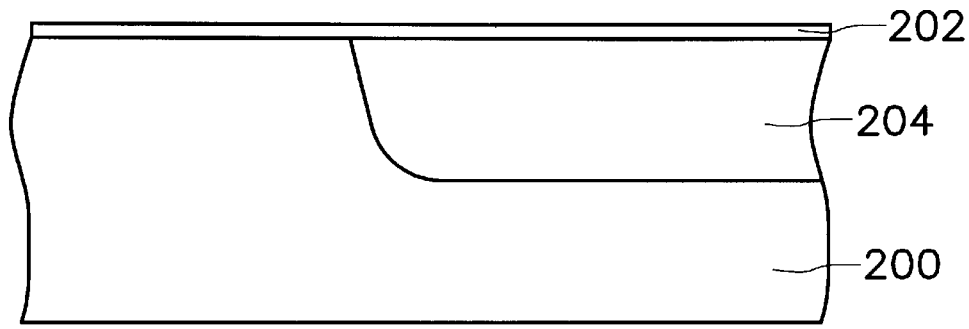
FIGS. 2A through 2F are schematic, cross-sectional views showing a portion of a high-voltage device according to one preferred embodiment of the invention.

In FIG. 2A, a substrate 200 is provided. For example, the substrate is a P-type silicon substrate or an N-type silicon substrate. In the following steps of the preferred embodiment of the invention, the substrate 200 described below is designated as a the P-type silicon substrate. An oxide layer 202 is formed on the substrate 200. A mask layer (not shown) is formed over the substrate 200. An N-type doped ion implantation is performed with a low doping concentration on the substrate 200 exposed by the mask layer. The mask layer is removed. A thermal step is performed to drive the implanted ions in to form an N$^{--}$-type first doped region 204. The N$^{--}$-type first doped region 204 is formed in the substrate 200 and is used as a portion of drift regions for carriers moving between a source region and a drain region.

In the N$^{--}$-type first doped region 204 described above, the doping concentration is low enough to prevent the occurrence of potential crowding on the edge of the drain region. This is one of features of the invention. With the low doping concentration of the N$^{--}$-type first doped region 204, the breakdown voltage of high-voltage device thus increases.

Figure 2B:
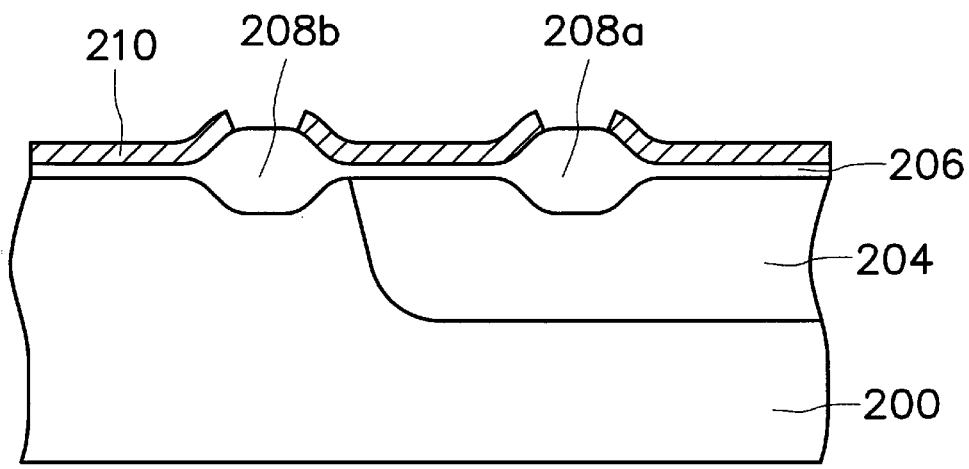

In FIG. 2B, the oxide layer 202 is removed. A pad oxide layer 206 is formed on the substrate 200. A prior oxidation step is performed to form field oxide layers 208a and 208b on the pad oxide layer 206. The field oxide layer 208a is located in the N$^{--}$-type first doped region 204. The field oxide layer 208b is located on the substrate 200 near the N$^{--}$-type first doped region 204. The field oxide layer 208a is used to increase the channel length between the source region and the drain region. For example, the field oxide layers 208a and 208b are formed by the following steps. A patterned mask layer 210 is formed on the pad oxide layer 212. The material of the patterned mask layer 210 comprises silicon nitride. A wet oxidation step is performed to oxidize portions of the pad oxide layer 206 exposed by the mask layer 210 to form the field oxide layers 208a and 208b.

Figure 2C:
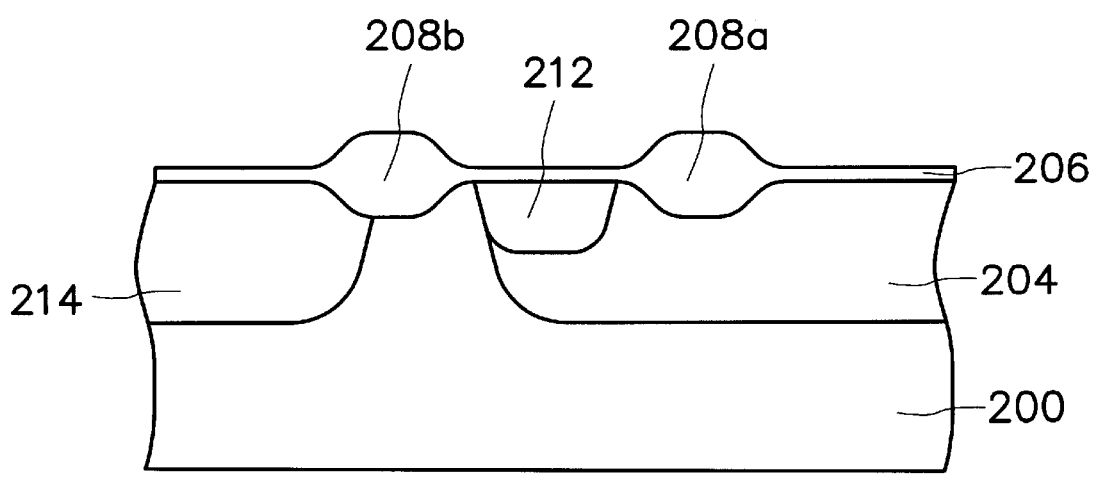

In FIG. 2C, the patterned mask layer 210 is removed. Another mask layer (not shown) is formed over the substrate 200. The mask layer exposes the region between the field oxide layers 208a and 208b. A self-aligned ion implantation step is performed to form an N$^{-}$-type second doped region 212 between the field oxide layers 208a and 208b, using the mask layer and the field oxide layer 208a and 208b as masks. The mask layer is removed. The doping concentration in the N$^{-}$-type second doped region 212 is higher than the concentration of N$^{--}$-type first doped region 204. A P$^{--}$-type third doped region 214 is formed on the other side of the field oxide layer 208b and opposite the N$^{--}$-type first doped region 204.

The N$^{--}$-type first doped region 204, the N$^{-}$-type second doped region 212 and the P$^{--}$-type third doped region 214 shown in FIG. 2C are used as drift regions for carriers of the source/drain region. The N$^{--}$-type first doped region 204 with lower ion doping concentration than the N$^{-}$-type second doped region 212 is used to increase the breakdown voltage. Unfortunately, as the ion doping concentration is light, the performance of the current driving is decreased. In the invention, the N$^{-}$-type second doped region 212 is formed within a portion of the N$^{--}$-type first doped region 204 to increase the current driving performance as the breakdown voltage is increased. The drift regions, such as the N$^{--}$-type first doped region 204, the N$^{-}$-type second doped region 212 and the P$^{--}$-type third doped region 214, are features of the invention. Furthermore, the self-aligned step to form the N$^{-}$-type second doped region 212 is a feature of the invention.

Figure 2D:
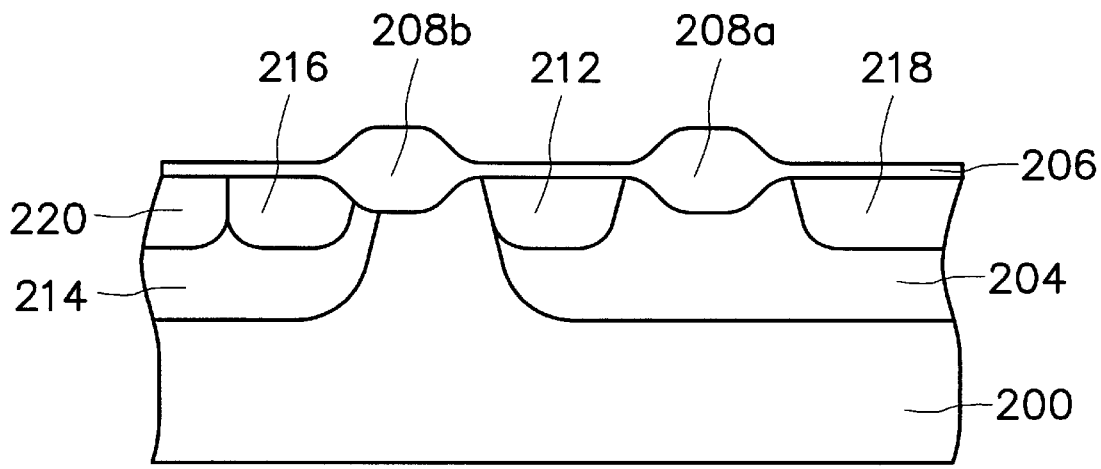

In FIG. 2D, an N$^{+}$-type source region 216 and an N$^{+}$-type drain region 218 are formed. The N$^{+}$-type source region 216 is located within the top portion of the P$^{--}$-type third doped region 214 near the field oxide layer 208b. The N$^{+}$-type drain region 218 is located within the top portion of the N$^{--}$-type first doped region 204 near the other side of the field oxide layer 208a and opposite the N$^{-}$-type second doped region 212. The doping concentrations of the N$^{+}$-type source region 216 and of the N$^{+}$-type drain region 218 are higher than the doping concentration of the N$^{--}$-type first doped region 204. A P$^{--}$-type fourth doped region 220 is formed within the P$^{--}$-type third doped region near the N$^{+}$-type source region 216 by performing an ion implantation step at a part of the pad oxide layer 206 which is exposed by a mask later (not shown).

Figure 2E:
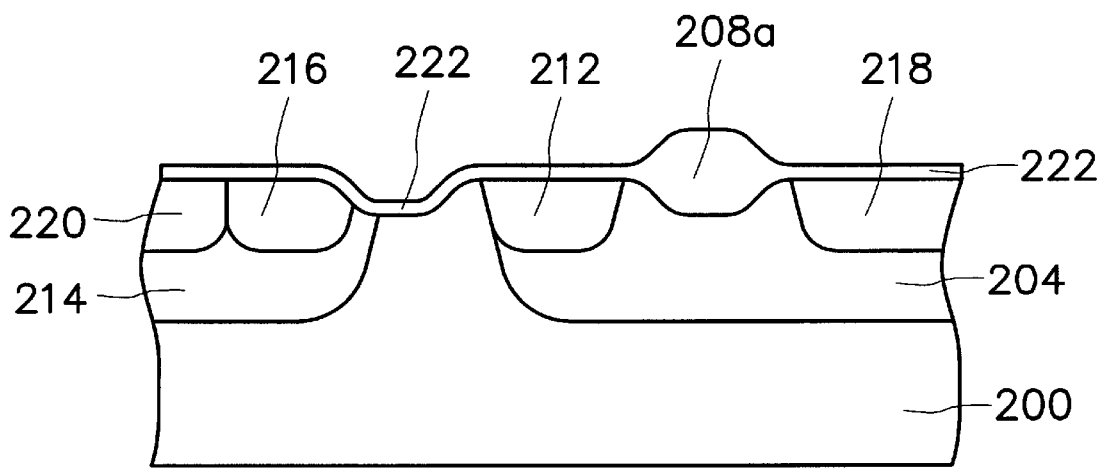

In FIG. 2E, the pad oxide layer 206 and the field oxide layer 208b are removed. A gate oxide layer 222 is formed on the substrate 200, for example, by thermal oxidation.

Figure 2F:
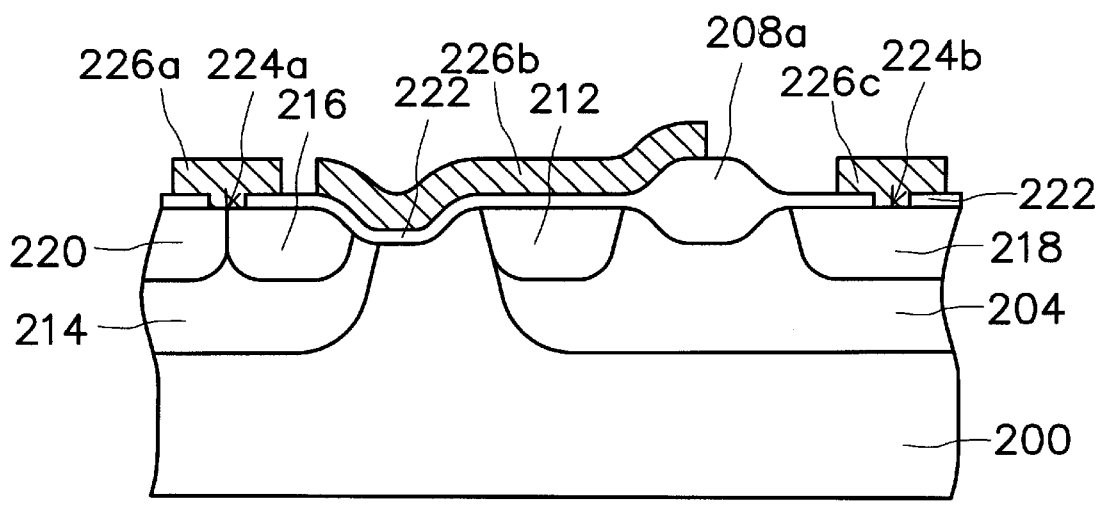

In FIG. 2F, portions of the gate oxide layer 222 are removed to form opening 224a and 224b and expose a part of the N$^{+}$-type source region 216, a part of the N$^{+}$-type drain region 218 and a part of the P$^{-}$-type fourth doped region 220. A conductive layer is formed on the structure described above, for example, by chemical vapor deposition (CVD) and is patterned to form a source electrode 226a, a gate electrode 226b and a drain electrode 226c. The material of the conductive layer includes aluminum. The gate electrode 226b, which is dished, is located in the position formerly occupied by the removed field oxide layer 208b. The gate electrode 226b provides a dishing channel that decreases the curvature of the electrical distribution lines while the high-voltage device is operated under a high voltage. The breakdown voltage is thus increased.

Furthermore, the gate electrode 226b, the source electrode 226a and the drain electrode 226c are simultaneously formed so that the steps for forming a high-voltage device are thus decreased to reduce the cycle time and cost of the fabrication process.

In summary, the features of the high-voltage device of the invention include the following:

1. The invention provides the $N^{---}$-type first doped region 204 with properly low doping concentration to prevent the occurrence of potential crowding on the edge of the drain region nearby channel. With low doping concentration of the $N^{---}$-type first doped region 204, the breakdown voltage of the high-voltage device increases. In the invention, the $N^{-}$-type second doped region 212 is formed to increase the current driving performance as the breakdown voltage is increased by the $N^{---}$-type first doped region 204.

2. The field oxide layers 208a and 208b are used as masks in the self-aligned ion implantation step. The effective channel length between the source region 216 and the drain region 218 is thus easily controlled.

3. The gate electrode 204 of the invention is dished so that a dished channel is obtained. The curvature of the electrical distribution lines within the channel is decreased while the high-voltage device is operated under a high voltage. Thus, the breakdown voltage is increased.

4. The source electrode 226a, the gate electrode 226b and the drain electrode 226c are formed at the same time. A prior technique for forming these electrodes comprises steps of: forming a gate electrode, forming a defined insulating layer to form openings therein and forming a source/drain electrode. The invention provides a method that reduces the cycle time and the cost for forming the high-voltage device.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a high-voltage device, comprising the steps of:

providing a substrate with a first electrical type;

forming a first doped region with a second electrical type in the substrate;

forming a first field oxide layer located on the first doped region and a second field oxide layer on the substrate near the first doped region;

forming a second doped region with the second electrical type within the substrate between the first field oxide layer and the second field oxide layer;

forming a third doped region with the first electrical type on the substrate on the other side of the second field oxide layer and opposite the second doped region;

forming a drain region within the second doped region and a source region within the third doped region nearby the second field oxide layer, wherein the drain region and the source region have the second electrical type;

forming a fourth doped region within the first doped region within the third doped region nearby the source region;

removing the second field oxide layer;

forming a gate oxide layer on the substrate, wherein the gate oxide layer and the first field oxide layer completely cover the substrate;

forming openings to expose a part of the source region and to expose a part of the drain region; and forming a gate electrode, a source electrode connecting to the source region and a drain electrode connecting to the drain region.

2. The method according to claim 1, wherein the first electrical type is P-type and the second electrical type is N-type.

3. The method according to claim 1, wherein the first electrical type is N-type and the second electrical type is P-type.

4. The method according to claim 1, wherein the second doped region is formed by performing a self-aligned step using the first field oxide layer and the second field oxide layer as masks.

5. The method according to claim 1, wherein the doping concentration of the first doped region and the doping concentration of the third doped region are the same.

6. The method according to claim 1, wherein the doping concentration of the first doped region is lower than the doping concentration of the second doped region.

7. The method according to claim 1, wherein the doping concentration of the second doped region is lower than the doping concentrations of the source region and of the drain region.

8. The method according to claim 1, wherein the doping concentration of the third doped region is lower than the doping concentration of the fourth doped region.

9. The method according to claim 1, wherein the material used to form the gate electrode, the source electrode and the drain electrode comprises aluminum.

10. A method of forming a high-voltage device, comprising the steps of:

providing a P-type substrate;

forming an $N^{---}$-type doped region in the substrate;

forming a first field oxide layer located on the first doped region and a second field oxide layer on the substrate near the $N^{---}$-type doped region;

forming a $N^{-}$-type doped region within the $N^{---}$-type doped region between the first field oxide layer and the second field oxide layer;

forming a $P^{---}$-type doped region in the substrate on the other side of the second field oxide layer and opposite the $N^{-}$-type doped region;

forming a $N^{+}$-type drain region within the second doped region and a $N^{+}$-type source region within the $P^{---}$-type doped region nearby the second field oxide layer;

forming a $P^{-}$-type doped region within the $N^{---}$-type doped region within the $P^{---}$-type doped region nearby the source region;

removing the second field oxide layer;

forming a gate oxide layer on the substrate, wherein the gate oxide layer and the first field oxide layer completely cover the substrate;

forming openings to expose a part of the source region and to expose a part of the drain region; and forming a gate electrode, a source electrode connecting to the source region and a drain electrode connecting to the drain region.

11. The method according to claim 10, wherein the second doped region is formed by performing a self-aligned step using the first field oxide layer and the second field oxide layer as masks.

12. The method according to claim 10, wherein the material used to form the gate electrode, the source electrode and the drain electrode comprises aluminum.

* * * * *